United States Patent
Amit et al.

(10) Patent No.: US 9,692,447 B2
(45) Date of Patent: Jun. 27, 2017

(54) THREE DIMENSIONAL GRID COMPRESSION STORAGE

(71) Applicant: INTERNATIONAL BUSINESS MACHINES CORPORATION, Armonk, NY (US)

(72) Inventors: Jonathan Amit, Omer (IL); Jonathan Fischer-Toubol, Tel Aviv (IL); Chaim Koifman, Rishon Lezion (IL); Sergey Marenkov, Tel Aviv (IL); Orit Nissan-Messing, Hod Ha Sharon (IL); Assaf Yaari, Rosh-HaAyin (IL)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 263 days.

(21) Appl. No.: 14/682,205

(22) Filed: Apr. 9, 2015

(65) Prior Publication Data

US 2016/0301424 A1    Oct. 13, 2016

(51) Int. Cl.
*G06F 3/06* (2006.01)
*H03M 7/30* (2006.01)

(52) U.S. Cl.
CPC ........ *H03M 7/6041* (2013.01); *G06F 3/0619* (2013.01); *G06F 3/0665* (2013.01); *G06F 3/0689* (2013.01); *H03M 7/30* (2013.01); *H03M 7/3057* (2013.01); *H03M 7/6058* (2013.01)

(58) Field of Classification Search
CPC .... H03M 7/6041; H03M 7/30; H03M 7/3057; H03M 7/6058; G06F 3/0619; G06F 3/0665; G06F 3/0689

USPC ........ 711/114, 118, 154, 158, 221; 709/209; 710/36, 38; 714/4.1, 5.1
See application file for complete search history.

(56) References Cited

U.S. PATENT DOCUMENTS

| | | | |
|---|---|---|---|
| 7,584,226 B2 * | 9/2009 | Fatula, Jr. | G06F 11/1464 |
| 7,847,799 B2 | 12/2010 | Taubin | |
| 7,970,856 B2 * | 6/2011 | Goodman | H04L 67/2842 709/216 |
| 8,886,744 B1 * | 11/2014 | Pabla | G06F 9/5072 709/217 |
| 2007/0206007 A1 | 9/2007 | Taubin | |
| 2009/0184956 A1 | 7/2009 | Kim et al. | |
| 2017/0006135 A1 * | 1/2017 | Siebel | H04L 67/02 |

OTHER PUBLICATIONS

"IBM Storwize family storage systems with SAS workloads on IBM Power Systems servers" pp. 1-48, IBM Systems and Technology Group ISV Enablement Mar. 2013.
Osuna et al., "Introducing the IBM Grid Access Manager" 90 pages, Apr. 2008, ibm.com/redbooks.

* cited by examiner

*Primary Examiner* — Stephen Elmore
(74) *Attorney, Agent, or Firm* — Griffiths & Seaton PLLC

(57) ABSTRACT

Various embodiments for data compression by a processor. Levels of data distribution are configured for data processing, including a first level of the data distribution incorporating a GRID network of data storage nodes, and a second level of the data distribution incorporating a GRID network of compressive nodes in communication with the GRID network of data storage nodes. Input/output (I/O) for an associated storage volume is load balanced between the data storage nodes, as data passes through the first level into the second level to be compressed or uncompressed.

21 Claims, 7 Drawing Sheets

THREE DIMENSIONAL GRID COMPRESSION STORAGE

BACKGROUND OF THE INVENTION

Field of the Invention

The present invention relates generally to computers, and more particularly, to data compression in computing and computing storage environments.

Description of the Related Art

In today's society, computer systems are commonplace. Computer systems may be found in the workplace, at home, or at school. Computer systems may include data storage systems, or disk storage systems, to process and store data. Data storage systems, or disk storage systems, are utilized to process and store data. A storage system may include one or more disk drives. These data processing systems typically require a large amount of data storage. Customer data, or data generated by users within the data processing system, occupies a great portion of this data storage. Many of these computer systems include virtual storage components. Data compression is widely used to reduce the amount of data required to process, transmit, or store a given quantity of information. Data compression is the coding of data to minimize its representation. Compression can be used, for example, to reduce the storage requirements for files, to increase the communication rate over a channel, or to reduce redundancy prior to encryption for greater security. Traditionally, however, data compression consumes a significant amount of computing (e.g. central processing unit "CPU") resources.

SUMMARY OF THE DESCRIBED EMBODIMENTS

Various embodiments for data compression by a processor are provided. Levels of data distribution are configured for data processing, including a first level of the data distribution incorporating a GRID network of data storage nodes, and a second level of the data distribution incorporating a GRID network of compressive nodes in communication with the GRID network of data storage nodes. Input/output (I/O) for an associated storage volume is load balanced between the data storage nodes, as data passes through the first level into the second level to be compressed or uncompressed.

In addition to the foregoing exemplary embodiment, other exemplary embodiments are provided and supply related advantages. The foregoing summary has been provided to introduce a selection of concepts in a simplified form that are further described below in the Detailed Description. This Summary is not intended to identify key features or essential features of the claimed subject matter, nor is it intended to be used as an aid in determining the scope of the claimed subject matter. The claimed subject matter is not limited to implementations that solve any or all disadvantages noted in the background.

BRIEF DESCRIPTION OF THE DRAWINGS

In order that the advantages of the invention will be readily understood, a more particular description of the invention briefly described above will be rendered by reference to specific embodiments that are illustrated in the appended drawings. Understanding that these drawings depict embodiments of the invention and are not therefore to be considered to be limiting of its scope, the invention will be described and explained with additional specificity and detail through the use of the accompanying drawings, in which.

DETAILED DESCRIPTION OF CERTAIN EMBODIMENTS

GRID storage, or GRID-Oriented storage is a specialized approach to store data using multiple, self-contained interconnected storage nodes such that any node can communicate with any other node without the data having to pass through a centralized switch.

GRID storage is built from an X number of modules, each containing interface and data nodes. The interface nodes allow the modules to interface with outside computing components (such as network devices), while the data nodes allow data to be stored in an underlying physical layer, for example. A major advantage of grid storage lies in its uniform distribution architecture. The uniformity of the distribution of data nodes architecturally offers a level of load-balancing, fault-tolerance and redundancy across the system. The architecture implies that if one storage node fails, or a pathway between two particular nodes is interrupted, the network can reroute traffic across another path or to a redundant data node.

Compressing data is an efficient way to save space on storage systems. Data compression, however, creates challenges to performing random access operations to the compressed output. Data compression, however, typically consumes a significant amount of compute (CPU, for example) resources. In one example, data may be compressed before being written to the underlying physical layer, which saves disk space and reduces the number of I/Os issued to the disk. In general, all storage facilities benefit from compressed storage, including such storage services such as snapshot, mirroring/remote mirroring, and cloning.

Dual node compression storage is composed of a cluster of two nodes, each node controlling a set of associated physical volumes and maintaining its own cache. In order to improve the response time, the user may receive an acknowledgment for writes when they are stored in the cache and synchronized to the cache of the peer node as well.

Figure 1:
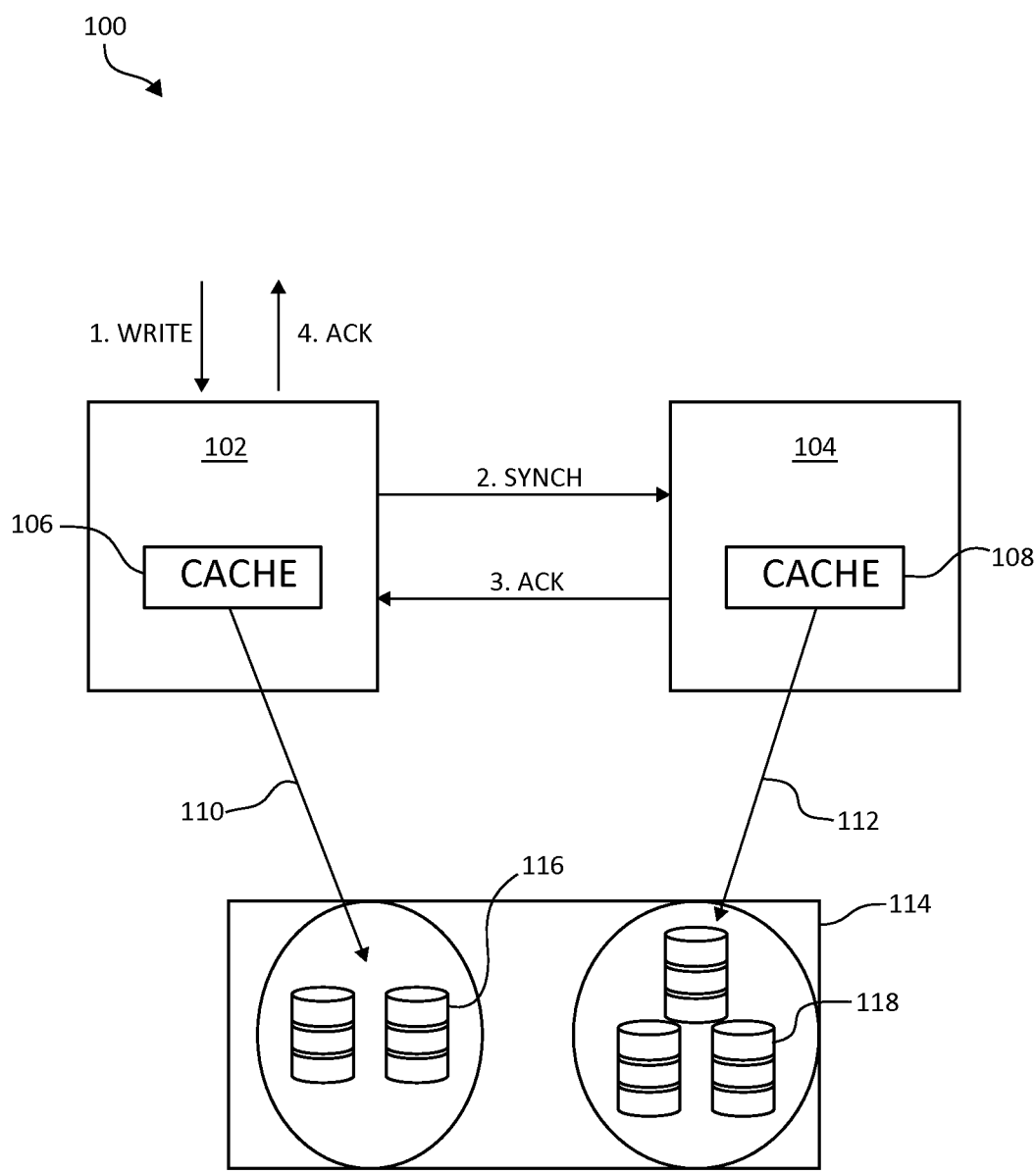
FIG. 1 is a block diagram illustrating an exemplary cluster of two nodes in which dual node compression storage is implemented.

FIG. 1 illustrates exemplary dual node compression storage 100 as known in the prior art. Two nodes 102, 104 are shown. Each node 102, 104 contains a cache 106, 108 component. The cache components 106, 108 are then in communication with storage 114. For example, cache 106 writes to volumes 116, while cache 108 writes to volumes 118 as shown. In a typical example, a write request is received in the node 102. A synch message is conferred to the node 104, and an acknowledgement is returned to the node 102, and thereby, to the user as shown.

Figure 2:
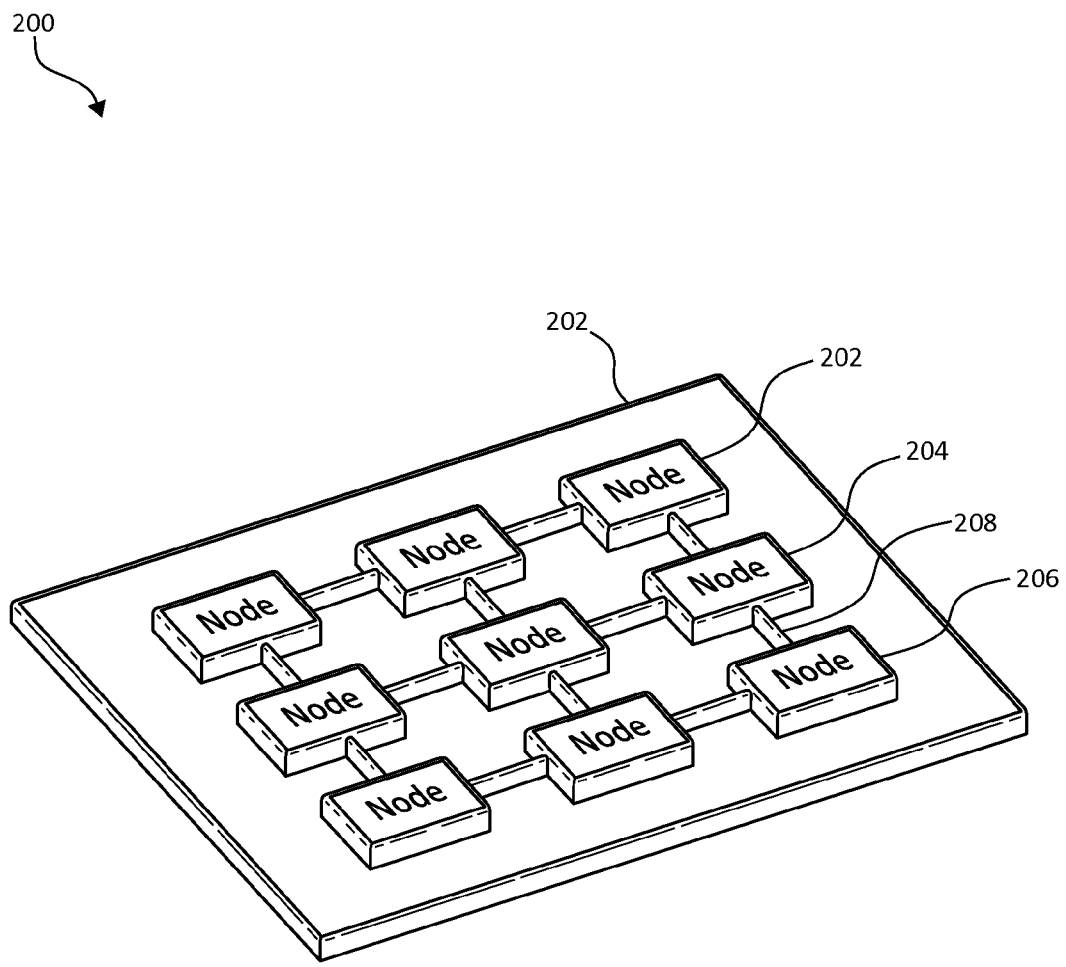
FIG. 2 is a block diagram illustrating an exemplary two-dimensional GRID data storage architecture.

FIG. 2, following, illustrates exemplary two-dimensional GRID storage architecture 200. The GRID 202 incorporates a number of individual GRID nodes 202, 204, 206, etc., as shown. The nodes 202, 204, 206 are in communication with each other throughout the GRID 202 (e.g., connection 208).

In GRID architecture, such as that illustrated in FIG. 2 by architecture 200, each user volume is divided into small slices and distributed among the different nodes. Each compression node is then responsible for some of the volume's non-contiguous slices, and not for the entire volume. Some of the dual node compression properties, such as temporal locality of the data or free space management in the volume are not accessible. In view of these characteristics, a need exists for an entirely new architecture to support compression in GRID storage.

In view of the foregoing, the mechanisms of the illustrated embodiments provide mechanisms implementing a new architecture allowing the use of real-time compression functionality in GRID storage. In one embodiment, a two-dimensional GRID storage system architecture is expanded to a three-dimensional, compressed, GRID system by overlaying a new compression layer on the GRID storage. Adding the new compression layer to the GRID system may be accomplished, in one embodiment, by using an additional data distribution scheme as will be further illustrated.

Both distribution schemes, (e.g., data and compression), may be implemented to coalesce and operate independently one from the other. These mechanisms may be accomplished without incurring any negative performance impact, while maintaining existing GRID load-balancing advantages.

In one embodiment, the new compression layer may be implemented to reside between the interface node and data node, again as will be further illustrated. The compression layer may include a number of compression nodes that process the data and forward the processed data to the data and/or interface node, depending on GRID distribution and workflow, for example.

Figure 3:
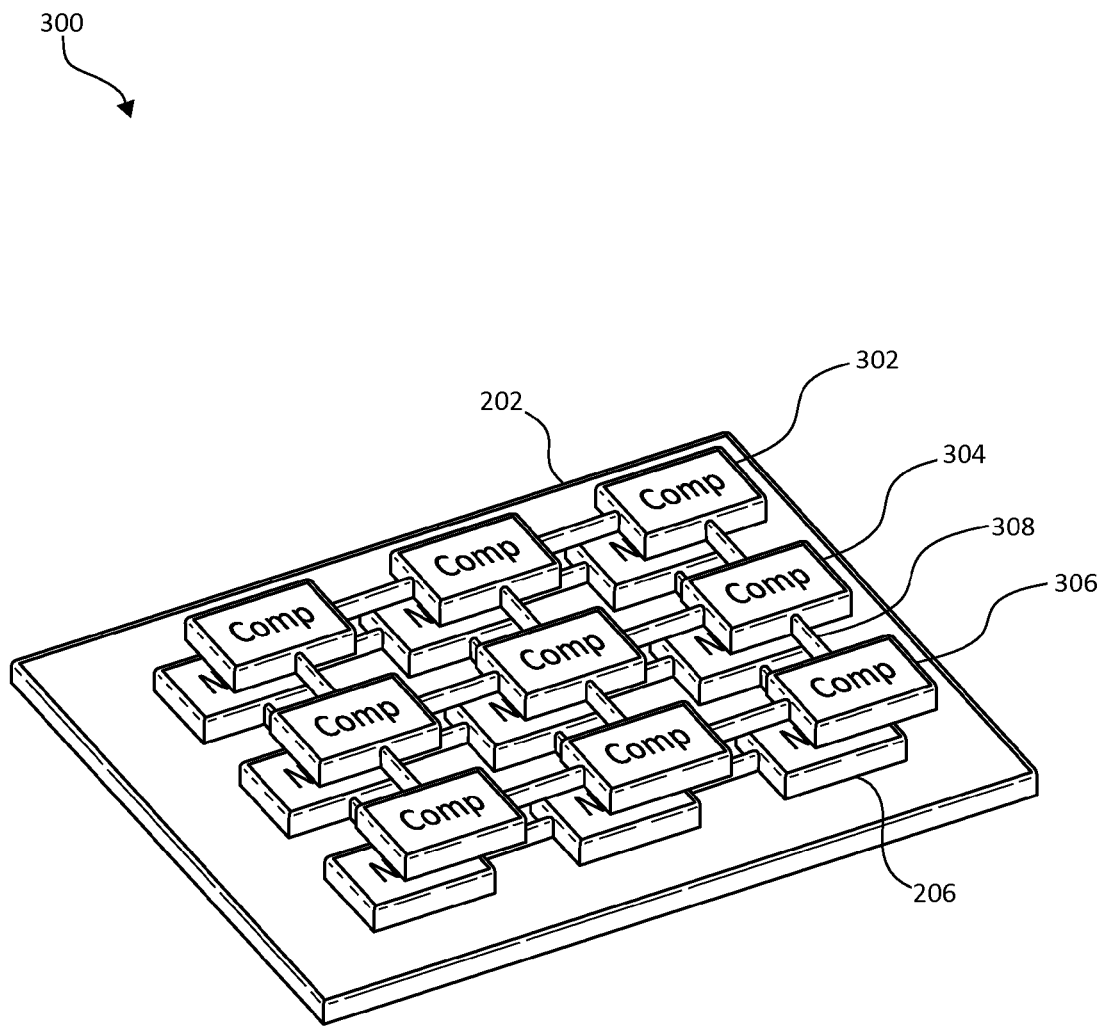
FIG. 3 is a block diagram illustrating a three-dimensional (3D) GRID data processing and storage architecture, in which aspects of the present invention may be realized.

FIG. 3, following, illustrates an exemplary three-dimensional GRID storage architecture 300, in which various aspects of the present invention may be implemented. Grid architecture 300 incorporates the grid structure of GRID 202, including nodes 206, etc. An additional level of compression/compressive nodes 304, 306 is added to the GRID 202. Compressive nodes 304, 306, etc., are in communication with other compressive nodes in the same manner that nodes 204, 206 in the underlying layer are configured (e.g., through connection 308). In addition, compressive nodes 304, 306 are in communication with nodes 204, 206 in the underlying layer as shown.

In the three-dimensional (3D) GRID compression architecture then, in one embodiment, an additional layer is added to the system: the compression layer. This new layer results in the addition of a new compression node in each storage module. As a result, some storage modules/embodiments may include an interface node, data node and now a compressive node. Other storage modules/embodiments may include solely a data node and compressive node (i.e., some storage modules are required to include interface nodes, but not all). As previously described, the compression layer may be configured to reside between the interface node and data node in each module.

In one embodiment, input/output (I/O) for compressed volumes pass through the compression node, which compresses and un-compresses the data back and forth to the data and/or interface layer based on GRID distribution and workflow. In order to allow multiple compression nodes to operate on a single user volume (versus the previous requirement of dividing individual volumes across multiple nodes), the volume may be divided into regions as will be presently described. Since a particular system may contain many regions, the compression node itself may be configured to operate in terms of sections, which are aggregates of regions. In one embodiment, the sections may correspond to the following equation:

$$S=R/N \quad (1),$$

where S is the section number,
R is the region number, and
N is the number of sections.

Use of sections is useful for a number of benefits. These benefits include an ability to provide load balancing functionality between compression nodes. Each compression node may be configured to handle several sections. Upon a compressive node/module failure, that particular module's sections may be re-distributed and re-balanced between the remaining compressive nodes in the system.

In addition, the use of sections allows for the establishment of compression objects. Every section of a particular volume (which, again, may be constructed from many regions), may be defined and implemented as a compression object. In this manner, the total number of compression objects needed may be conserved.

Much like the classic GRID architecture distribution (e.g., FIG. 2, previously), the interface layer may be implemented to direct I/Os to the right compression node by, in one embodiment, looking up which section is handled by which compression node in a compression distribution table. To identify the particular section (compressed object) number, in one embodiment, the following formula may be implemented:

$$N=((L+O)/R)/S \quad (2),$$

where N is the section number,
L is the logical block address (LBA),
O is a per volume offset,
R is a region size, and
S is the number of sections.

Figure 4:
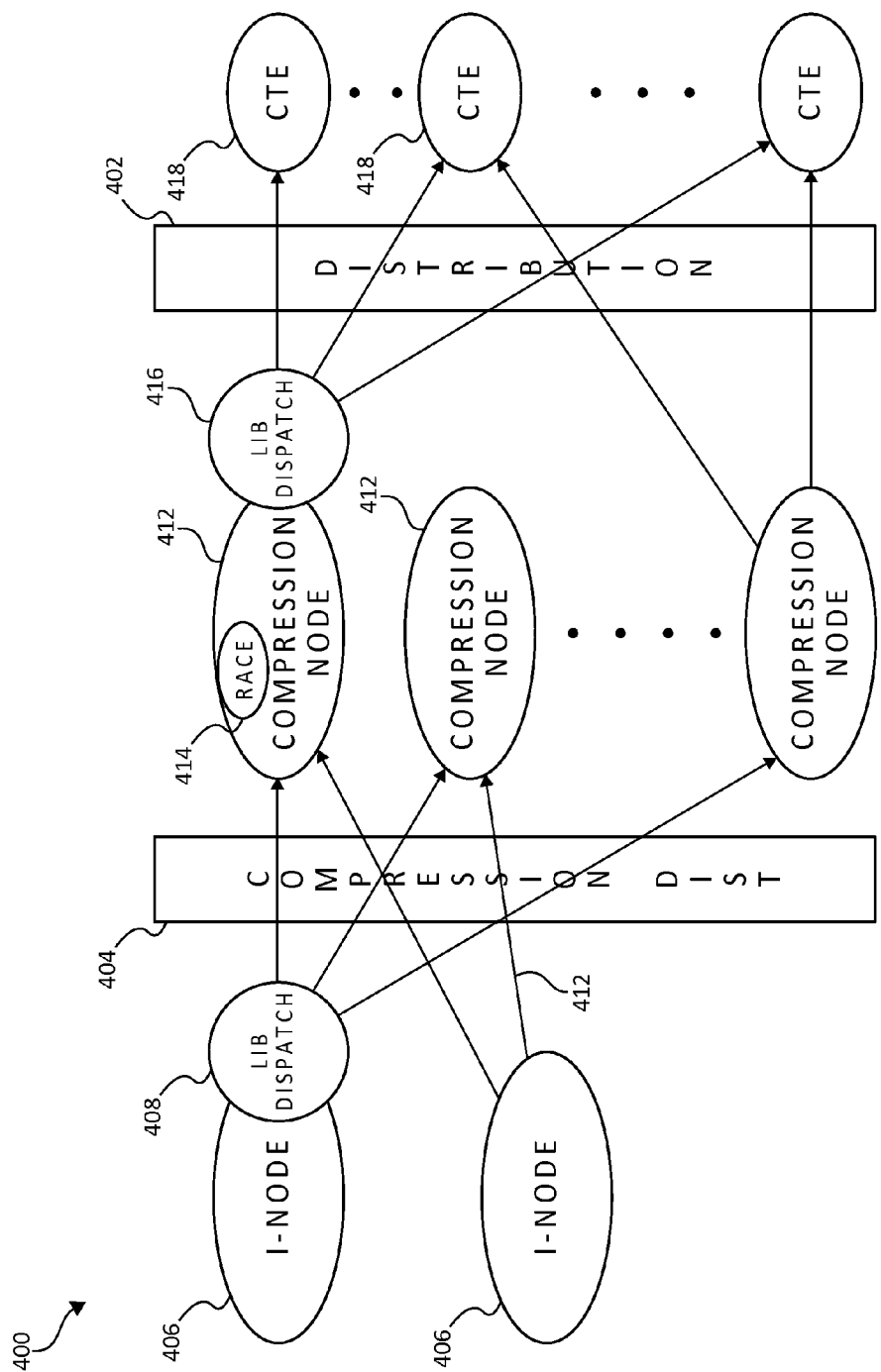
FIG. 4 is a block diagram illustrating exemplary GRID architecture including compression; here again in which aspects of the present invention may be realized.

Turning now to FIG. 4, exemplary compression node architecture 400 is depicted in accordance with one embodiment of the present invention. Compression node architecture 400 incorporates two levels of distribution as previously described, including a data distribution block 402 and a compression distribution block 404 as shown. FIG. 4 illustrates the implementation flexibility of the 3D compression storage architecture across layers. For example, a series of interface nodes 406 are connected across the compression distribution network to various compression nodes 412. One interface node 406 implements a libdispatch mechanism 408 to reach each compression node 412 through the compression distribution network 404. Similarly, a particular compression node uses an additional libdispatch mechanism 416 across the data distribution node to reach each of the CTE nodes 418 as shown.

Compression sections may be evenly distributed between compression nodes, much like slices are distributed between data nodes in two-dimensional GRID distribution. In case of failure, when a compression redistribution is warranted/required, redistribution/rebuild processes for the compression objects as well as for the individual slices may be then triggered.

Figure 5:
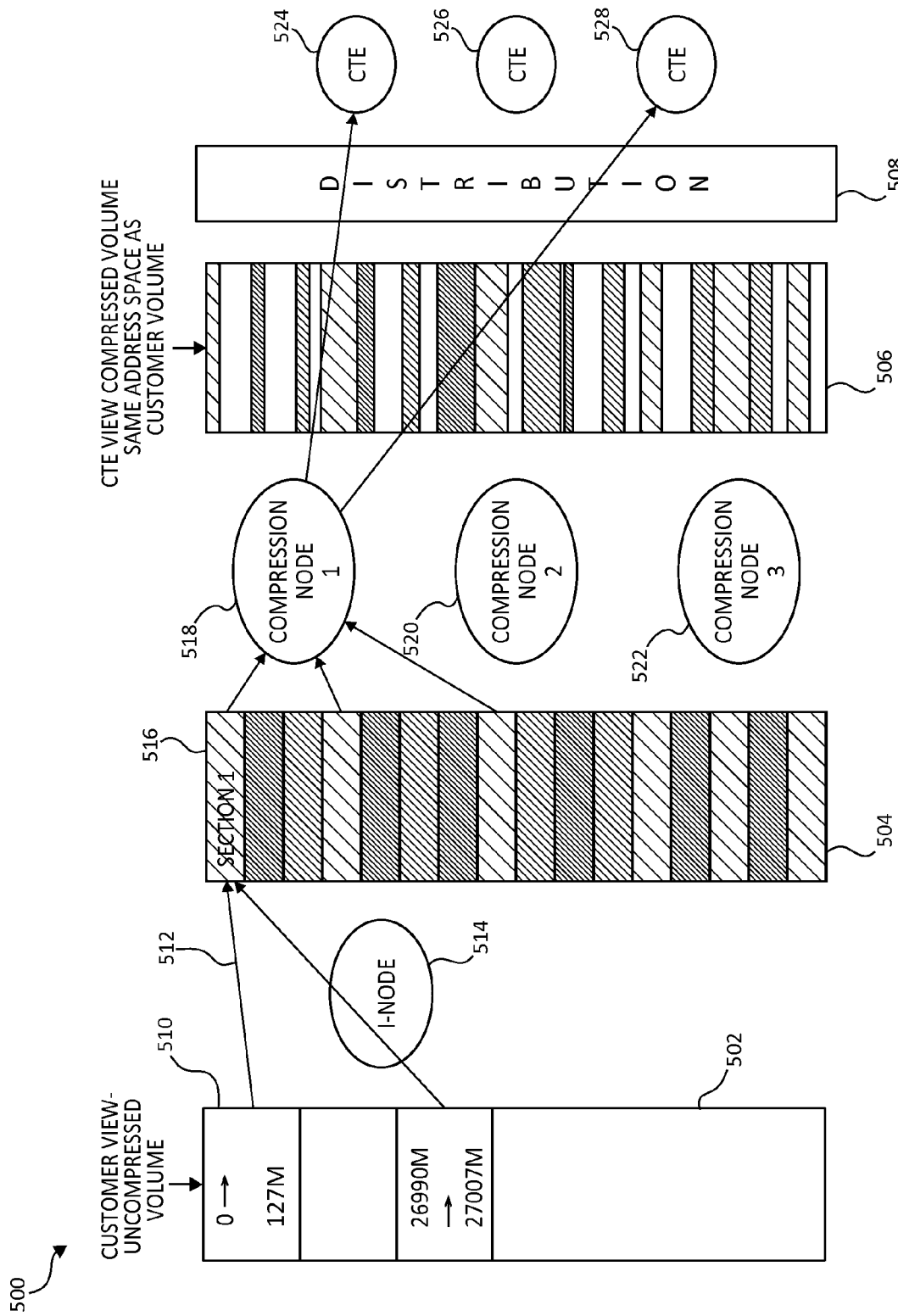
FIG. 5 is a block diagram illustrating various functionality of compression node architecture in accordance with the present invention, both from the view of a customer and CTE.

FIG. 5, following, bears this methodology out, here shown as exemplary three-dimensional compression storage functionality 500, from both the customer (user) viewpoint and a CTE viewpoint. The user is presented with an uncompressed volume 502 with various blocks of data 510 which are passed through connections 512 through the interface nodes 514 and organized by section (e.g., section 516) in organized volume 504.

Carrying the functionality 500 further, the data is passed to the compression nodes 518, 520, 522, which compress the data. From the CTE volume 506, this compressed data corresponds to the same address space as the user volume 502 as shown. The compressed data is then passed through the data distribution 508 network to the various CTE nodes 524, 526, and 528.

Advantages of the three-dimensional GRID compression architecture include effective data compression, a reduction of user bandwidth requirements as compressed data is sent for mirroring/GRID sync requirements, and the single (versus multiple) compression of data, also freeing up computing resources.

Figure 6:
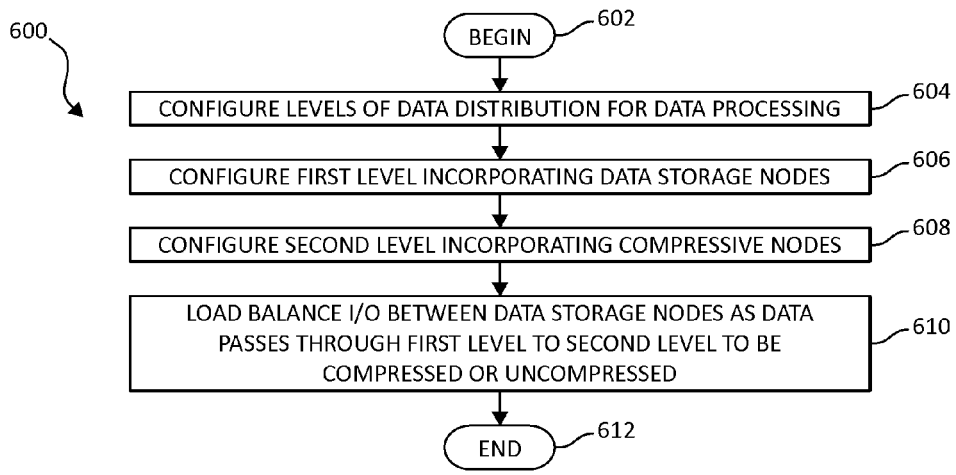
FIG. 6 is a flowchart illustrating an exemplary method for data compression, in which aspects of the present invention may be realized.

FIG. 6, following illustrates an exemplary method for implementing a three-dimensional compression architecture for GRID storage, in accordance with one exemplary embodiment. The method 600 begins (step 602) by configuring levels of data distribution for data processing (step 604). A first level, incorporating data storage nodes, is configured (step 606). A second level, incorporating compressive/compression nodes, is configured (step 608). I/O is load balanced between the data storage nodes as data passes through the first level to the second level to be compressed or uncompressed (step 610). The method 600 then ends (step 612).

Figure 7:
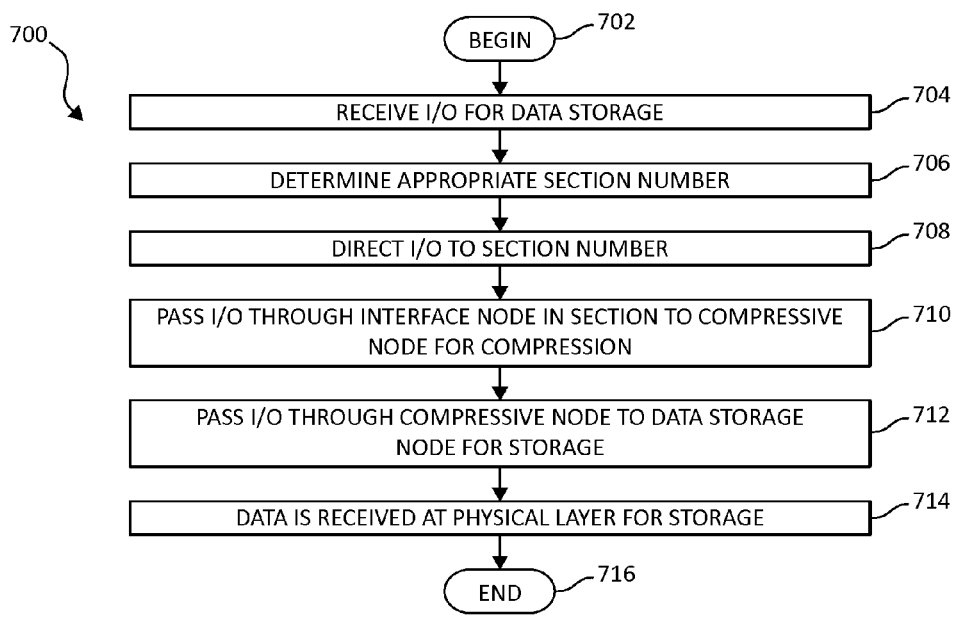
FIG. 7 is a flowchart illustrating an additional exemplary method for data compression, again in which aspects of the present invention may be realized.

FIG. 7, following, illustrates an additional exemplary method for implementing three-dimensional compression GRID storage, in accordance with an additional embodiment of the present invention. Method 700 begins (step 702), with the reception of I/O for data storage (step 704). An appropriate section number corresponding to the user data is determined (step 706) by, for example, looking in the compression distribution table as previously described. The I/O is directed, through the appropriate interface node to the corresponding section number (step 708).

Method 700 continues to step 710, where the I/O is passed through the interface node to the appropriate compressive node/module corresponding to the data's section number for compression. The I/O then passes through the compressive node to the data distribution network for data storage (step 712), and the data is received at the physical layer for storage (step 714). The method 700 ends (step 716).

Figure 8:
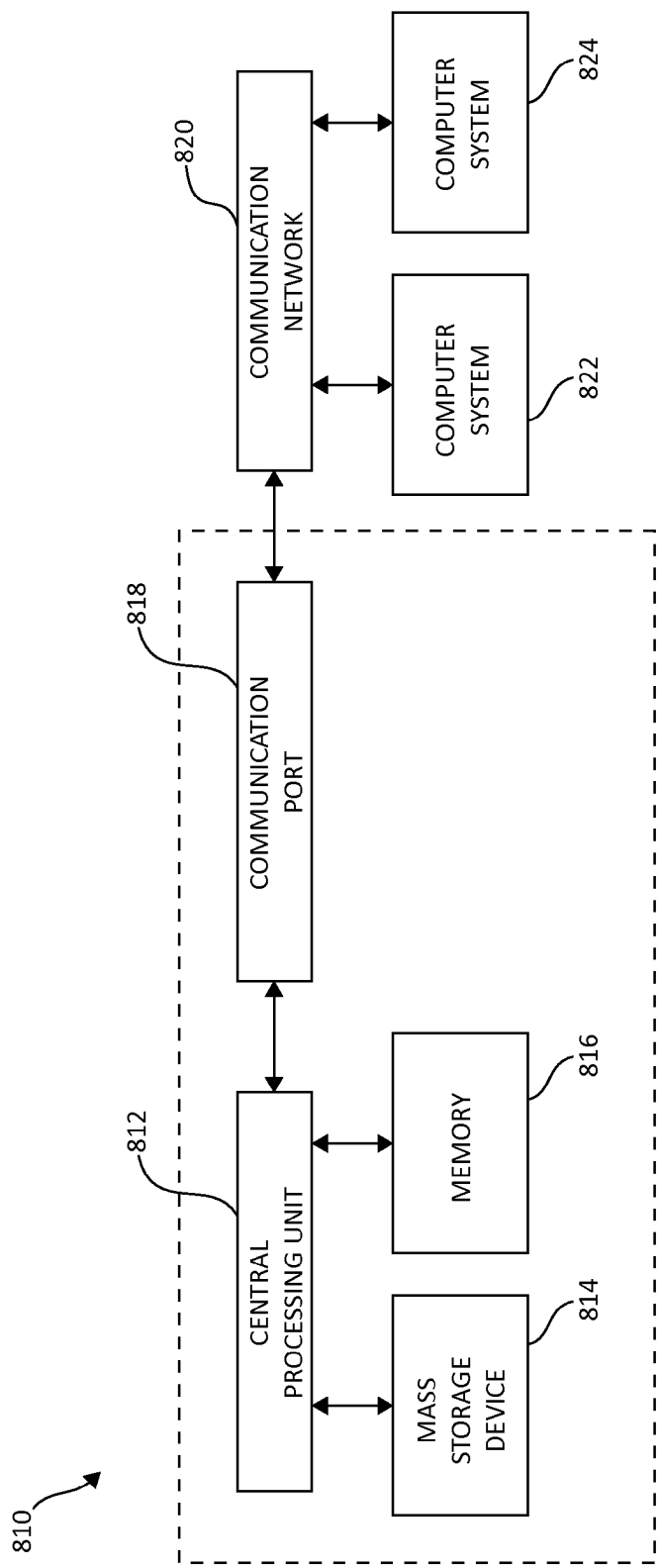
FIG. 8 is a block diagram of exemplary hardware, including a computer processor (CPU), memory, and other devices configurable to implement various aspects of the illustrated embodiments.

Turning now to FIG. 8, following, exemplary computer hardware, including computer system 800, in which aspects of the present invention may be realized, is depicted. Computer system 800 includes central processing unit (CPU) 802, which is connected to mass storage device(s) 804 and memory device 806. Mass storage devices may include hard disk drive (HDD) devices, which may be configured in a redundant array of independent disks (RAID). The data compression, section lookup, data movement through distribution, and similar operations further described may be executed on devices 802, located in system 800 or elsewhere.

Memory device 806 may include such memory as electrically erasable programmable read only memory (EEPROM) or a host of related devices. Memory device 806 and mass storage device 814 are connected to CPU 802 via a signal-bearing medium. In addition, CPU 802 is connected through communication port 818 to a communication network 820, having an attached plurality of additional computer systems 822 and 824. The computer system 800 may include one or more processor devices (e.g., CPU 802) and additional memory devices 806 for each individual component of the computer system 800 to execute and perform each operation described herein to accomplish the purposes of the present invention. In addition, the computer system may implement additional aspects of functionality such as the aforementioned compression distribution table, or other mechanisms described herein.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Small-talk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. A method for data compression by a processor, the method comprising:
configuring levels of data distribution for data processing, including a first level of the data distribution incorporating a GRID network of data storage nodes, and a second level of the data distribution incorporating a GRID network of compressive nodes in communication with the GRID network of data storage nodes;
wherein input/output (I/O) for an associated storage volume is load balanced between the data storage nodes, as data passes through the first level into the second level to be compressed or uncompressed.

2. The method of claim 1, further including configuring the second level incorporating the GRID network of compressive nodes between the first level incorporating the GRID network of data storage nodes and an additional level incorporating a GRID network of interface nodes.

3. The method of claim 2, further including directing the I/O from one of the interface nodes to one of the compressive nodes, or directing the I/O from one of the compressive nodes to one of the data storage nodes.

4. The method of claim 1, further including pursuant to load balancing the I/O between the data storage nodes, upon a failure of one of the data storage nodes in the GRID network, redistributing the I/O among the remaining data storage nodes.

5. The method of claim 1, further including organizing sections of the storage volume into a plurality of compression objects to be passed to the compressive nodes.

6. The method of claim 5, further including directing the I/O to an appropriate one of the compressive nodes by determining a relationship between an associated section and the appropriate one of the compressive nodes in a compression distribution table.

7. The method of claim 6, further including determining a section number as a function of a logical block address (LBA), a volume offset, a region size, and a number of sections.

8. A system for data compression, comprising:
a processor that configures levels of data distribution for data processing, including a first level of the data distribution incorporating a GRID network of data storage nodes, and a second level of the data distribution incorporating a GRID network of compressive nodes in communication with the GRID network of data storage nodes;
wherein input/output (I/O) for an associated storage volume is load balanced between the data storage nodes, as data passes through the first level into the second level to be compressed or uncompressed.

9. The system of claim 8, wherein the processor configures the second level incorporating the GRID network of compressive nodes between the first level incorporating the GRID network of data storage nodes and an additional level incorporating a GRID network of interface nodes.

10. The system of claim 9, wherein the processor directs the I/O from one of the interface nodes to one of the compressive nodes, or directs the I/O from one of the compressive nodes to one of the data storage nodes.

11. The system of claim 8, wherein the processor, pursuant to load balancing the I/O between the data storage nodes, upon a failure of one of the data storage nodes in the GRID network, redistributes the I/O among the remaining data storage nodes.

12. The system of claim 8, wherein the processor organizes sections of the storage volume into a plurality of compression objects to be passed to the compressive nodes.

13. The system of claim 12, wherein the processor directs the I/O to an appropriate one of the compressive nodes by determining a relationship between an associated section and the appropriate one of the compressive nodes in a compression distribution table.

14. The system of claim 13, wherein the processor determines a section number as a function of a logical block address (LBA), a volume offset, a region size, and a number of sections.

15. A computer program product for data compression by a processor, the computer program product comprising a non-transitory computer-readable storage medium having computer-readable program code portions stored therein, the computer-readable program code portions comprising:

a first executable portion that configures levels of data distribution for data processing, including a first level of the data distribution incorporating a GRID network of data storage nodes, and a second level of the data distribution incorporating a GRID network of compressive nodes in communication with the GRID network of data storage nodes;

wherein input/output (I/O) for an associated storage volume is load balanced between the data storage nodes, as data passes through the first level into the second level to be compressed or uncompressed.

16. The computer program product of claim 15, further including a second executable portion that configures the second level incorporating the GRID network of compressive nodes between the first level incorporating the GRID network of data storage nodes and an additional level incorporating a GRID network of interface nodes.

17. The computer program product of claim 16, further including a third executable portion that directs the I/O from one of the interface nodes to one of the compressive nodes, or directs the I/O from one of the compressive nodes to one of the data storage nodes.

18. The computer program product of claim 15, further including a second executable portion that, pursuant to load balancing the I/O between the data storage nodes, upon a failure of one of the data storage nodes in the GRID network, redistributes the I/O among the remaining data storage nodes.

19. The computer program product of claim 15, further including a second executable portion that organizes sections of the storage volume into a plurality of compression objects to be passed to the compressive nodes.

20. The computer program product of claim 19, further including a third executable portion that directs the I/O to an appropriate one of the compressive nodes by determining a relationship between an associated section and the appropriate one of the compressive nodes in a compression distribution table.

21. The computer program product of claim 20, further including a fourth executable portion that determines a section number as a function of a logical block address (LBA), a volume offset, a region size, and a number of sections.

* * * * *